US006998872B1

(12) United States Patent
Chirania et al.

(10) Patent No.: US 6,998,872 B1
(45) Date of Patent: Feb. 14, 2006

(54) LOOKUP TABLE CIRCUIT OPTIONALLY CONFIGURABLE AS TWO OR MORE SMALLER LOOKUP TABLES WITH INDEPENDENT INPUTS

(75) Inventors: Manoj Chirania, Palo Alto, CA (US); Venu M. Kondapalli, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 10 days.

(21) Appl. No.: 10/859,836

(22) Filed: Jun. 2, 2004

(51) Int. Cl.
*H03K 19/177* (2006.01)

(52) U.S. Cl. ............................ 326/40; 326/39; 326/41

(58) Field of Classification Search ............ 326/37–41, 326/47, 113
See application file for complete search history.

(56) References Cited

U.S. PATENT DOCUMENTS

| | | | | |
|---|---|---|---|---|
| 5,926,036 A * | 7/1999 | Cliff et al. | .................... | 326/40 |
| 6,353,331 B1 * | 3/2002 | Shimanek | .................... | 326/39 |
| 6,400,180 B1 | 6/2002 | Wittig et al. | | |
| 6,621,298 B1 | 9/2003 | Agrawal et al. | | |

OTHER PUBLICATIONS

Xilinx, Inc.; "The Programmable Logic Data Book 1994"; published 1994; available from Xilinx, Inc., 2100 Logic Drive, San Jose, California 95124; pp. 2-110 thru 2-111, no month.

Altera Corp; "Stratix II Device Family Data Sheet"; v1.0; published Feb. 2004; available from Altera Corporation, 101 Innovation Drive, San Jose, California 95134; pp. 2-1 thru 2-22.

Ralf Krueger and Brent Przybus; WP209 (v1.0); "Virtex Variable-Input LUT Architecture"; Jan. 12, 2004; available from Xilinx, Inc., 2100 Logic Drive, San Jose, California 95124; pp. 1-6.

Anthony Cataldo and Ron Wilson; FPGA vendors revise logic for sub-100-nm era; EE Times; Feb. 2, 2004; downloaded fron http://www.eetimes.com/story/OEG20040202S0019; 4 pages.

* cited by examiner

*Primary Examiner*—Anh Q. Tran
(74) *Attorney, Agent, or Firm*—Lois D. Cartier

(57) ABSTRACT

Lookup table (LUT) circuits can optionally be configured as two or more smaller LUTs having independent input signals. A LUT circuit includes a tristate buffer circuit coupled between first and second multiplexer stages. The data input of the tristate buffer circuit is provided as a first output signal from the LUT circuit. The output of the second multiplexer stage provides the second LUT output signal. The tristate buffer circuit can include a tristate buffer with a pullup and a pulldown on the output terminal. To configure the circuit as a single LUT, the buffer is enabled (tristate disabled), and both the pullup and pulldown are turned off. To configure the circuit as two separate LUTs, the buffer is tristated and either the pullup or the pulldown is enabled. Additional multiplexer stages and tristate buffer circuits can be included to enable the division of the circuit into larger numbers of LUTs.

27 Claims, 9 Drawing Sheets

LOOKUP TABLE CIRCUIT OPTIONALLY CONFIGURABLE AS TWO OR MORE SMALLER LOOKUP TABLES WITH INDEPENDENT INPUTS

FIELD OF THE INVENTION

The invention relates to programmable logic devices (PLDS). More particularly, the invention relates to a lookup table circuit for a PLD that can optionally be configured as two or more smaller lookup tables, each having input signals independent from one another.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable.

FIG. 1 is a simplified illustration of an exemplary FPGA. The FPGA of FIG. 1 includes an array of configurable logic blocks (LBs 101*a*–101*i*) and programmable input/output blocks (I/Os 102*a*–102*d*). The LBs and I/O blocks are interconnected by a programmable interconnect structure that includes a large number of interconnect lines 103 interconnected by programmable interconnect points (PIPs 104, shown as small circles in FIG. 1). PIPs are often coupled into groups (e.g., group 105) that implement multiplexer circuits selecting one of several interconnect lines to provide a signal to a destination interconnect line or logic block. Some FPGAs also include additional logic blocks with special purposes (not shown), e.g., DLLS, RAM, and so forth.

One programmable element commonly found in FPGA logic blocks is the lookup table, or LUT. A LUT is a memory array (e.g., a 16×1 array) that is addressable by a number of input signals (e.g., four input signals). By programming predetermined values into the memory array, the LUT can implement any function of the input variables. While 4-input functions are common in user circuits, it can also be desirable to provide simple and fast implementations of larger and/or smaller logic functions.

FPGAs have been manufactured that allow a combination of LUTs to be grouped together using dedicated logic, where the grouped LUTs can be used to implement larger functions. For example, the XC3000™ family of FPGAs from Xilinx, Inc. offers the capability of combining two 4-input LUTs to implement a 5-input function generator, as shown and described on pages 2–110 and 2–111 of "The Programmable Logic Data Book 1994", published in 1994 and available from Xilinx, Inc., 2100 Logic Dr., San Jose, Calif. 95124. (These pages are hereby incorporated herein by reference.)

In U.S. Pat. No. 6,400,180 B2, Wittig et al. utilize a different approach to the issue of providing versatility in function generator logic, by providing a single function generator circuit that can be optionally divided to function as two smaller LUTs. However, the two LUTs are not independent of each other, in that some of the input signals are shared between the two LUTs. (U.S. Pat. No. 6,400,180 B2, entitled "Configurable Lookup Table for Programmable Logic Devices" and issued Jun. 4, 2002, is hereby incorporated herein by reference, in its entirety.)

In the aforementioned patent, Wittig et al. describe a "versatile implementation module" (VIM) that includes a lookup table configurable in two different modes (see FIG. 3 of Wittig et al.). The VIM is configurable as two 5-input lookup tables (in 5-LUT and 6-LUT mode) or as one 8-input product term generator. In 5-LUT and 6-LUT mode, two of the input signals (g3 and g4) are shared between the two LUTs. Therefore, the described structure imposes some limitations on the user logic functions that can be combined in a single VIM.

To increase the flexibility of combining small user functions into a single LUT circuit, it is desirable to provide a LUT circuit for a PLD that allows the LUT circuit to be used as a single large LUT, or as two or more smaller LUTs with independent input signals.

SUMMARY OF THE INVENTION

The invention provides PLD lookup table (LUT) circuits that can optionally be configured as two or more smaller lookup tables, each having input signals independent from one another.

According to an embodiment of the invention, a LUT circuit includes memory cells, LUT input terminals, first and second output terminals, first and second multiplexer stages, and a tristate buffer circuit. The first multiplexer stage has input terminals coupled to the memory cells, select terminals coupled to at least a first one of the input terminals, and output terminals. A first output terminal of the first multiplexer stage is coupled to the first LUT output terminal. The second multiplexer stage has input terminals coupled to the output terminals of the first multiplexer stage, select terminals coupled to at least a second one of the input terminals, and an output terminal coupled to the second LUT output terminal.

The tristate buffer circuit is coupled between the first output terminal of the first multiplexer stage and a first input terminal of the second multiplexer stage. The tristate buffer circuit can include, for example, a tristate buffer with both a pullup and a pulldown on the output terminal. The tristate buffer, pullup, and pulldown can be controlled, for example, by configuration memory cells of the PLD.

To configure the LUT circuit as a single LUT, the tristate function of the buffer is disabled, and both the pullup and pulldown are turned off. To configure the LUT circuit as two separate LUTs with independent input signals, the data input to the tristate buffer circuit is provided as the first output signal for the LUT, and the buffer is tristated. Either the pullup or the pulldown on the output of the buffer is enabled, substituting either a high or a low value for the output of the preceding portion of the first multiplexer stage. This high or low value contributes to the overall function of the remaining portion of the LUT (i.e., to the second LUT output signal) by mimicking a value that could be stored in the memory cells being utilized by the first LUT output signal.

In some embodiments, the LUT circuit can optionally be divided into more than two smaller LUTs, or can optionally be divided into either two or more LUTs as desired. For example, a 6-input LUT circuit can be used as a single 6-input LUT, a 2-input LUT and a 4-input LUT with independent input signals, or three 2-input LUTs with independent input signals. This 6-input LUT circuit can be implemented, for example, by adding tristate buffer circuits between first and second multiplexer stages, and between second and third multiplexer stages, of the 6-input LUT.

BRIEF DESCRIPTION OF THE DRAWINGS

The present invention is illustrated by way of example, and not by way of limitation, in the following figures.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 1:
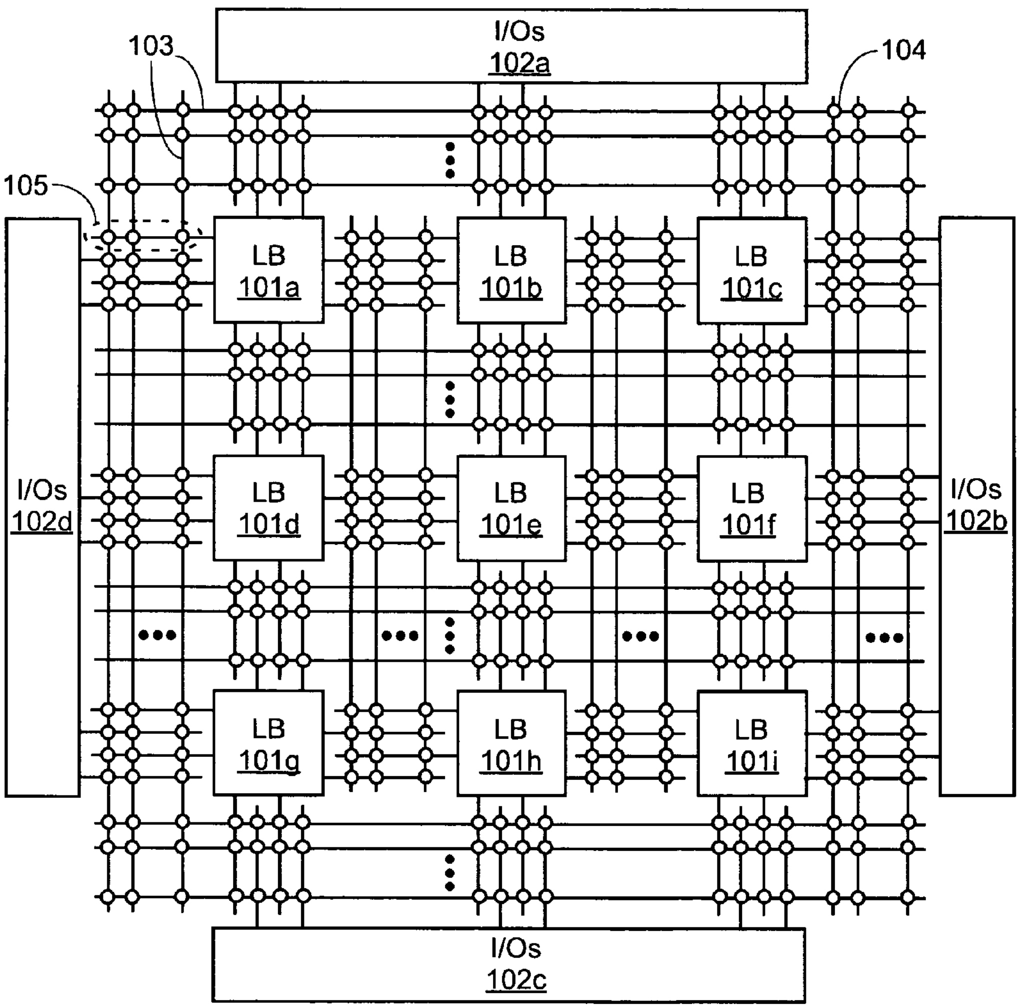
FIG. 1 is a simplified diagram of a well known Field Programmable Gate Array (FPGA) architecture.
Figure 2:
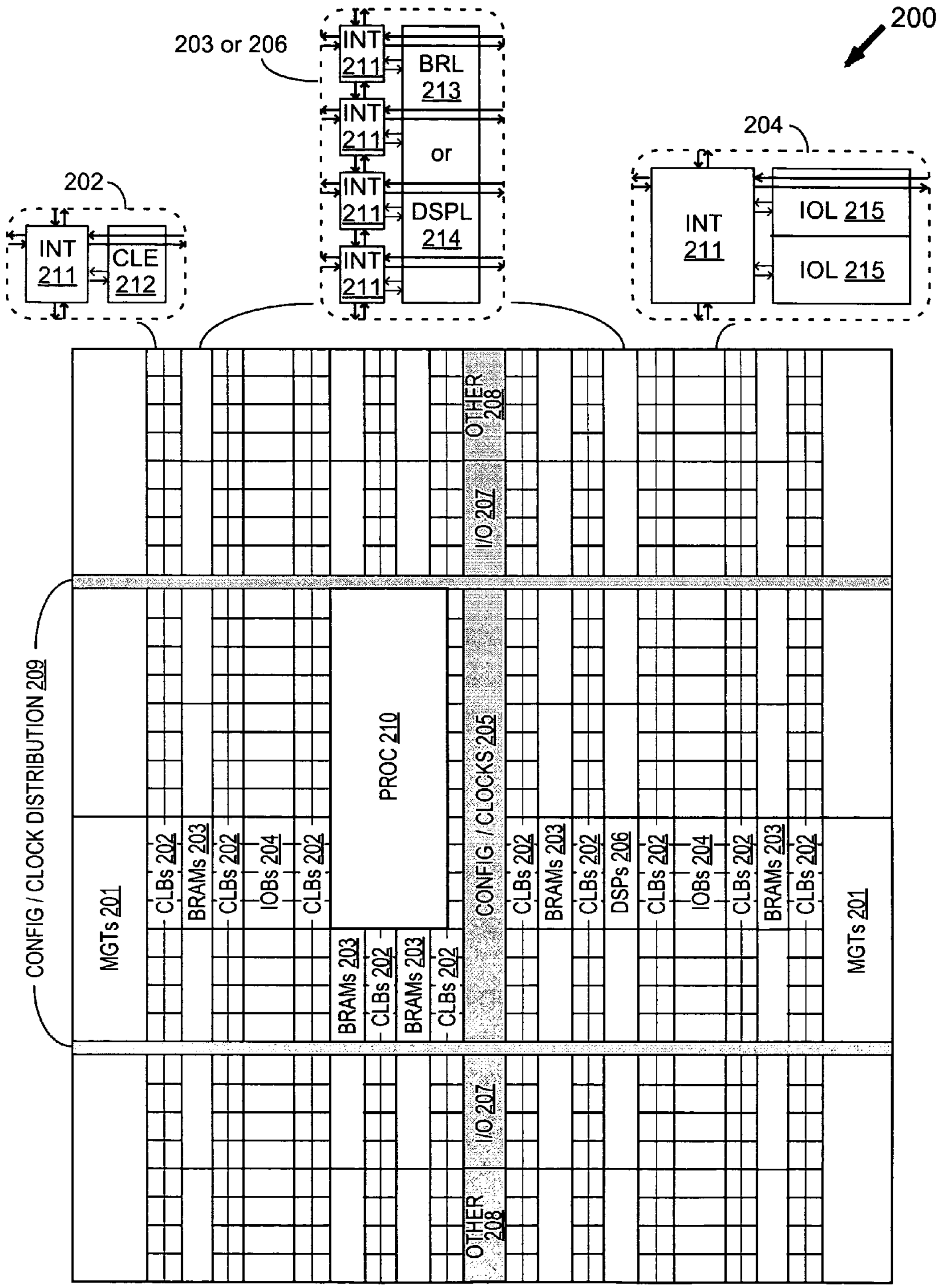
FIG. 2 is a block diagram of a Xilinx FPGA.

As noted above, advanced FPGAs can include several different types of programmable logic blocks in the array. For example, FIG. 2 illustrates an FPGA architecture 200 that includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 208 such as digital clock managers, analog-to-digital converters, system monitoring logic, and so forth. Some FPGAs also include dedicated processor blocks (PROC 210).

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An IOB 204 can include, for example, two instances of an input/output logic element (IOL 215) in addition to one instance of the programmable interconnect element (INT 211). As will be clear to those of skill in the art, the actual I/O pads connected, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. For example, the numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic.

Figure 3:
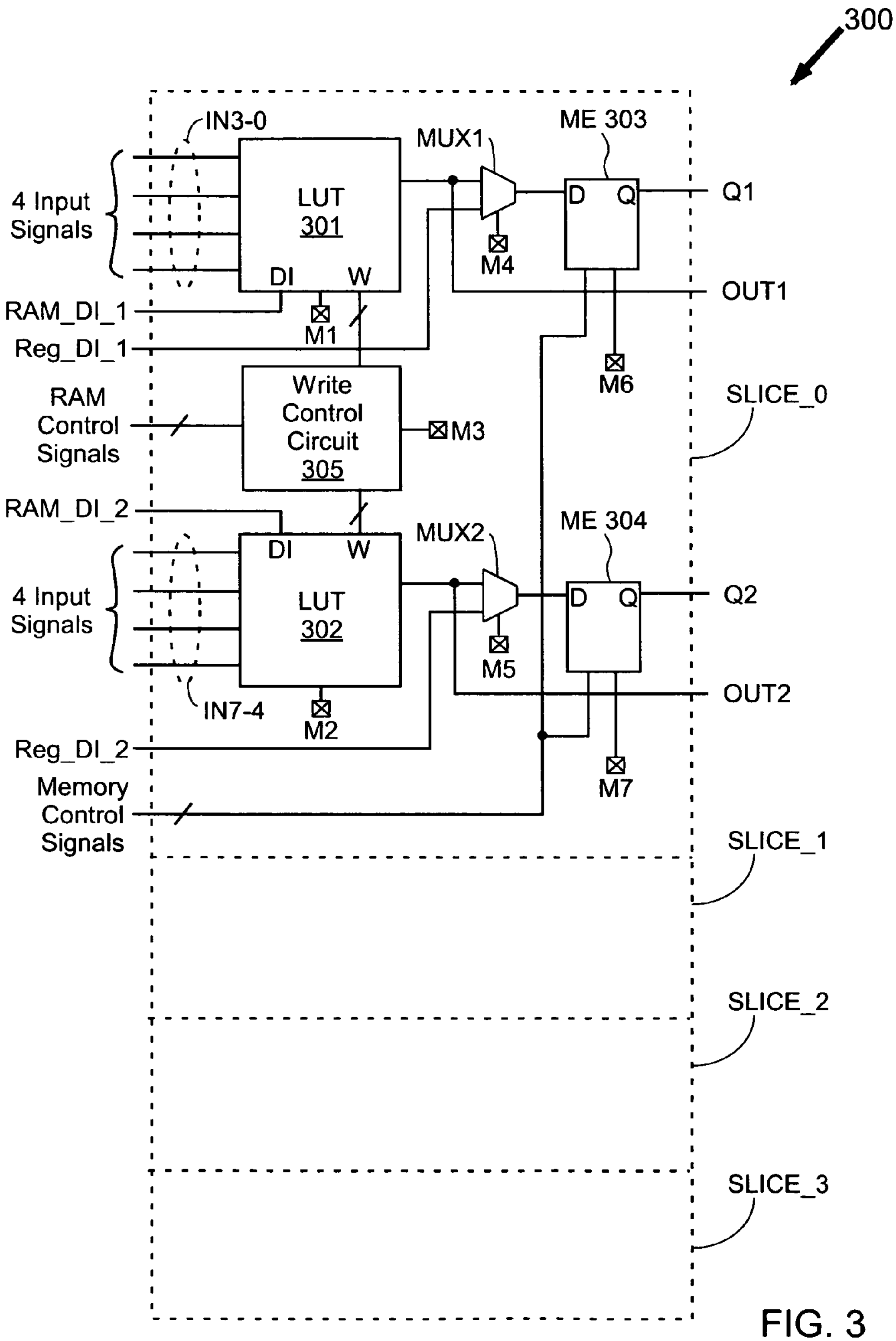
FIG. 3 is a simplified illustration of a known configurable logic element (CLE) in a Xilinx FPGA.

FIG. 3 illustrates in simplified form a configurable logic element (CLE) for an FPGA. CLE 300 of FIG. 3 includes four similar slices SLICE_O-SLICE_3. Each slice includes two lookup tables (LUTs) 301 and 302, a write control circuit 305, two multiplexers MUX1 and MUX2, and two output memory elements 303 and 304. The lookup tables, write control circuit, multiplexers, and output memory elements are all controlled by configuration memory cells M1–M7. Note that least some of configuration memory cells M1–M7 represent more than one memory cell. Additional configuration memory cells and logic elements are omitted from FIG. 3, for clarity.

Each LUT 301, 302 can function in any of several modes. When in lookup table mode, each LUT has four data input signals IN1–IN4 that are supplied by the FPGA interconnect structure (not shown) via input multiplexers (not shown). (In the present specification, the same reference characters are used to refer to terminals, signal lines, and their corresponding signals.) When in RAM mode, input data is supplied by an input terminal RAM_DI_1, RAM_DI_2 to the DI terminal of the associated LUT. RAM write operations in both LUTs are controlled by write control circuit 305, which supplies one or more write control signals W to both LUTs based on RAM control signals provided by the interconnect structure.

Each LUT 301, 302 provides a LUT output signal to an associated multiplexer MUX1, MUX2, which selects between the LUT output signal and an associated register direct input signal Reg_DI_1, Reg_DI_2 from the interconnect structure. Thus, each LUT can be optionally bypassed. The output of each multiplexer MUX1, MUX2 is provided to the data input terminal D of an associated output memory element (303, 304 respectively). Memory elements 303 and 304 are clocked by a clock signal CK (e.g., provided by a global clock network) and controlled by various other register control signals (e.g., from the interconnect structure or provided by configuration memory cells of the FPGA). Each memory element 303, 304 provides a registered output signal Q1, Q2. The output of each LUT 301, 302 is also provided to an output terminal OUT1, OUT2 of the CLE. Thus, each output memory element can be optionally bypassed. The slice also includes output multiplexers (not shown) that select from among the various output signals of the slice and provide the selected signals to the FPGA interconnect structure. These output multiplexers are also controlled by configuration memory cells (not shown).

Figure 4:
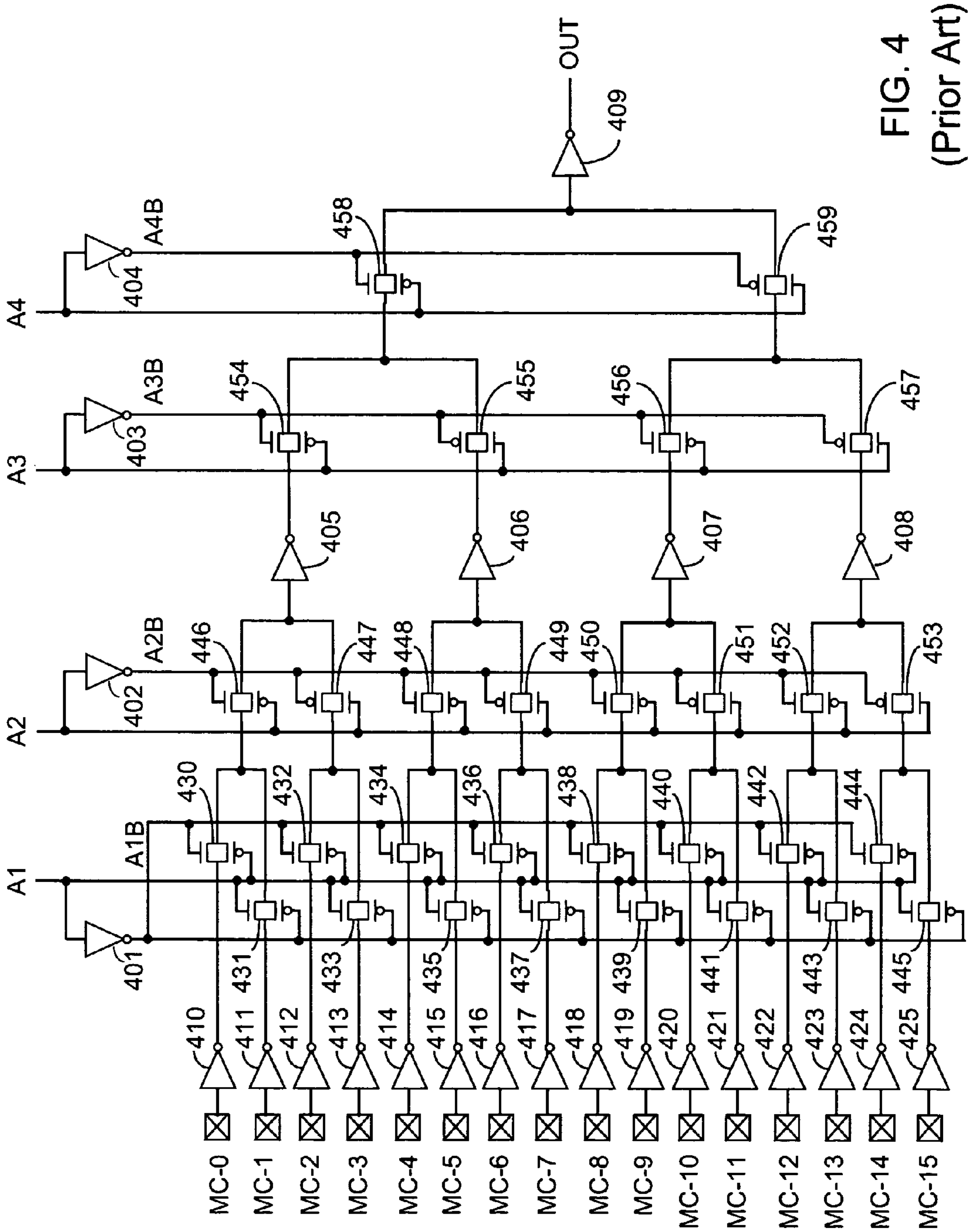
FIG. 4 illustrates a first known lookup table (LUT) circuit that can be used, for example, in the CLE of FIG. 3.

FIG. 4 illustrates in simplified form a well known 4-input lookup table (LUT) for a PLD. The lookup table is implemented as a four-stage 16-to-1 multiplexer. The four input signals A1–A4 together select one of 16 values stored in memory cells MC-0 through MC-15. Thus, the lookup table can implement any function of up to four input signals.

The four input signals A1–A4 are independent signals, each driving one stage of the multiplexer. Inverted versions A1B–A4B of signals A1–A4 are generated by inverters 401–404, respectively. Sixteen configuration memory cells MC-0 through MC-15 drive sixteen corresponding inverters 410–425, each of which drives a corresponding CMOS pass gate 430–445. In a first stage of the multiplexer, paired pass gates 430–431 form a 2-to-1 multiplexer controlled by signals A1 and A1B, which multiplexer drives a CMOS pass gate 446. Pass gates 432–445 are also paired in a similar fashion to form similar 2-to-1 multiplexers driving associated pass gates 447–453. In a second stage of the multiplexer, paired pass gates 446–447 form a 2-to-1 multiplexer controlled by signals A2 and A2B, which multiplexer drives an inverter 405. Similarly, pass gates 448–453 are paired to form similar 2-to-1 multiplexers driving associated inverters 406–408.

In a third stage of the multiplexer, driven by inverters 405–408, pass gates 454–455 are paired to form a 2-to-1 multiplexer controlled by signals A3 and A3B and driving a CMOS pass gate 458. Similarly, pass gates 456–457 are paired to form a similar 2-to-1 multiplexer driving a CMOS pass gate 459. In a fourth stage of the multiplexer, pass gates 458–459 are paired to form a 2-to-1 multiplexer controlled by signals A4 and A4B and driving an inverter 409. Inverter 409 provides the LUT output signal OUT.

Figure 5:
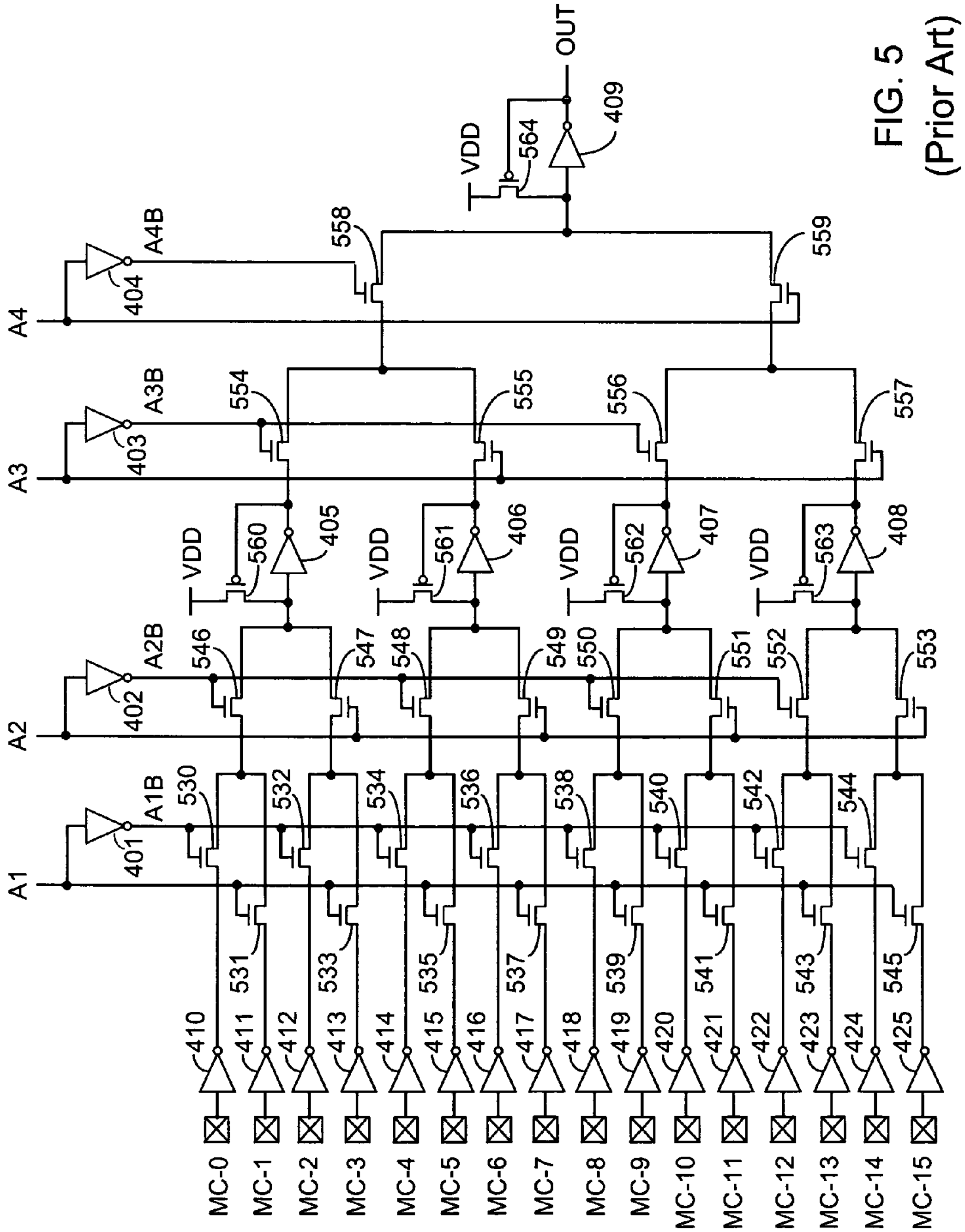
FIG. 5 illustrates a second known lookup table (LUT) circuit that can be used, for example, in the CLE of FIG. 3.

FIG. 5 illustrates another known 4-input LUT. The LUT of FIG. 5 is similar to that of FIG. 4, except that N-channel transistors 530–559 are substituted for CMOS pass gates 430–459. Because an N-channel transistor imposes a voltage drop on power high signals traversing the transistor, the node driving each inverter 405–409 is also enhanced by the addition of a pullup (e.g., a P-channel transistor) 560–564 to power high VDD. Each pullup 560–564 is gated by the output of the corresponding inverter 405–409. The pullup ensures that a high value on the node driving the inverter is pulled all the way to the power high value once a low value appears on the inverter output node.

The exemplary lookup tables of FIGS. 4 and 5 perform their designated functions well, providing any function of up to four variables. However, many user designs include functions of fewer than four variables. Therefore, each function of two or three variables that cannot be logically optimized into a larger function is typically implemented in a 4-input LUT, thereby rendering a portion of the LUT logic unused and the PLD logic resources underutilized.

Figure 6:
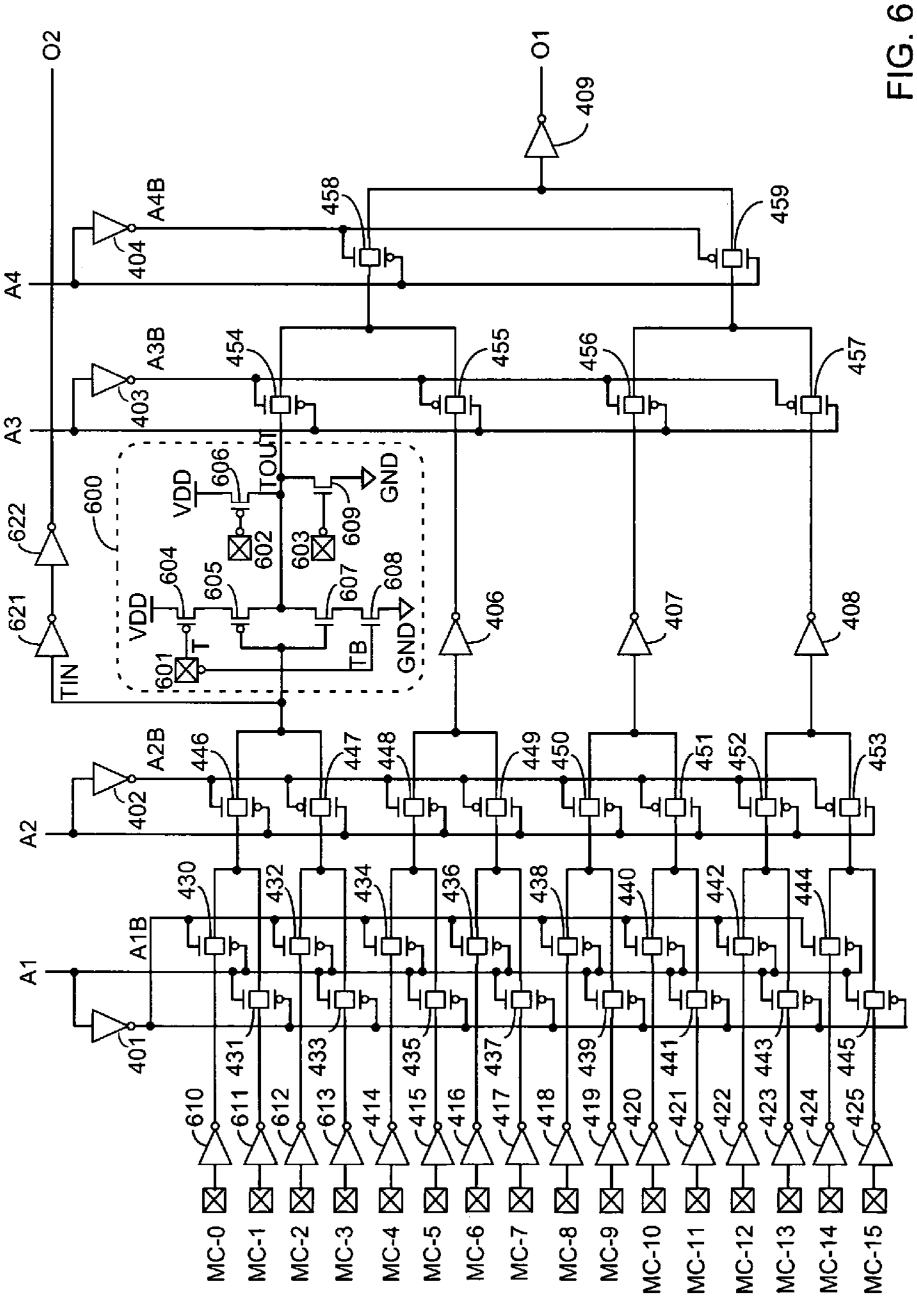
FIG. 6 illustrates a first 4-input LUT circuit according to an embodiment of the present invention, as well as a first tristate buffer circuit compatible with the LUT circuits of the present invention.

FIG. 6 illustrates in simplified form a 4-input LUT circuit according to an embodiment of the present invention. The illustrated LUT circuit, for example, can be used to implement LUTs 201, 202 of FIG. 3. The LUT circuit is implemented as a four-stage 16-to-1 multiplexer. In a first mode, the four input signals A1–A4 together select one of 16 values stored in memory cells MC-0 through MC-15, and the resulting selected value is placed on output terminal O1. Thus, the LUT circuit can implement any function of up to four input signals. In a second mode, input signals A1 and A2 together select one of four values stored in memory cells MC-0 through MC-3, and the resulting selected value is placed on output terminal O2. At the same time, input signals A3 and A4 together select either one of twelve values stored in memory cells MC-4 through MC-15 or a value placed on an internal node TOUT, and the resulting selected value is placed on output terminal O1. Thus, in the second mode the LUT circuit implements two 2-input functions.

Note that when the second mode is selected, memory cells MC-4 through MC-7 store the same value, memory cells MC-8 through MC-11 store the same value, and memory cells MC-12 through MC-15 store the same value. Thus, the values on input signals A1 and A2 have no effect on the value at output terminal O1.

In many respects, the circuit of FIG. 6 is similar to that of FIG. 4. Similar elements are identified with the same reference numerals as in FIG. 4, and the recurring elements are not again described. However, in the LUT circuit of FIG. 6, inverter 405 of FIG. 4 is replaced by tristate buffer circuit 600, and the input signal TIN to tristate buffer circuit 600 traverses two inverters 621–622 to provide an additional LUT output signal O2.

Tristate buffer circuit 600 includes a tristate buffer (elements 604–605 and 607–608) controlled by memory cell 601, a pullup 606 controlled by memory cell 602, and a pulldown 609 controlled by memory cell 603. The tristate buffer is coupled between the input terminal TIN and the output terminal TOUT of tristate buffer circuit 600, and comprises transistors 604, 605, 607, and 608 coupled in series between power high VDD and ground GND. Pullup 606 and pulldown 609 are coupled to the output terminal TOUT of tristate buffer circuit 600. When the PLD is an FPGA, for example, memory cells 601–603 can be configuration memory cells of the FPGA.

Note that a "bubble" on a memory cell output terminal in the figures herein denotes a complementary output value. This complementary output value can be taken from the complementary storage node of the memory cell, or can be provided by inverting the true output value, as is shown with respect to memory cells MC-0 through MC-15 in FIG. 6. Therefore, note also that inverters 610–613 and 414–425 could be omitted from FIG. 6 by taking the complementary memory cell output values directly from the complementary storage nodes of the memory cells. Similarly, the corresponding inverters could be omitted from the other LUT circuits illustrated in FIGS. 4–5 and 8–9. Also, as is well known, the inverse values of the memory cell values utilized in the illustrated figures could easily be used by modifying the logic controlled by the memory cells, using well known techniques. It will be apparent to one skilled in the art after reading this specification that the present invention can be practiced within these and other architectural variations.

In the first mode, tristate buffer circuit (TSB circuit) 600 functions as follows. (See Table 1.) A low value stored in memory cell 601 turns on P-channel transistor 604 (signal T is low) and also turns on N-channel transistor 608 (signal TB is high). Thus, the tristate function of tristate buffer circuit 600 is disabled, i.e., a value on the input terminal TIN of tristate buffer circuit 600 is passed to the output terminal TOUT. In this mode, pullup 606 is disabled by storing a low value in memory cell 602, i.e., P-channel transistor 606 is turned off. Similarly, pulldown 609 is disabled by placing by storing a high value in memory cell 603, i.e., N-channel transistor 609 is turned off. Therefore, the LUT circuit functions as a single 4-input LUT.

TABLE 1

| MC 601 | MC 602 | MC 603 | Node TOUT |
|---|---|---|---|
| 0 | 0 | 0 | contention, not supported |
| 0 | 0 | 1 | input value (first mode) |
| 0 | 1 | 0 | contention, not supported |
| 0 | 1 | 1 | contention, not supported |
| 1 | 0 | 0 | low (second mode) |

TABLE 1-continued

| MC 601 | MC 602 | MC 603 | Node TOUT |
|---|---|---|---|
| 1 | 0 | 1 | floating, not supported |
| 1 | 1 | 0 | contention, not supported |
| 1 | 1 | 1 | high (second mode) |

In the second mode, tristate buffer circuit 600 functions as follows. (See Table 1.) A high value stored in memory cell 601 turns off P-channel transistor 604 (signal T is high) and also turns off N-channel transistor 608 (signal TB is low). Thus, the tristate function of tristate buffer circuit 600 is enabled, i.e., a value on the input terminal TIN of tristate buffer circuit 600 is not passed to the output terminal TOUT. In this mode, exactly one of pullup 606 and pulldown 609 is enabled. In other words, either both memory cells 602, 603 store a low value (pullup 606 is turned off and pulldown 609 is turned on), or both memory cells 602, 603 store a high value (pullup 606 is turned on and pulldown 609 is turned off). The state where memory cell 602 stores a high value and memory cell 603 stores a low value is not supported, as shown in Table 1, as contention will occur at the output terminal of tristate buffer circuit 600.

Note that in the second mode, the value placed on the output terminal TOUT of tristate buffer circuit 600 can be either high or low. The choice of a high or low value (i.e., whether to enable pullup 606 or pulldown 609) is made based on the function to be implemented by the two remaining input signals A3 and A4. For example, Table 2 illustrates an example in which the LUT circuit of FIG. 6 implements two 2-input functions, O2=(A1 OR A2) and O1=(A3 XNOR A4). In this example, all three memory cells 601–602 store high values.

TABLE 2

| Memory Cell | Stored Value | Node | Value at Node |
|---|---|---|---|
| 601 | 1 | TIN, O2 | A1 OR A2 |
| 602 | 1 | TOUT | 1 |
| 603 | 1 | O1 | A3 XNOR A4 |
| MC-0 | 0 | | |
| MC-1 | 1 | | |
| MC-2 | 1 | | |
| MC-3 | 1 | | |
| MC-4 | 0 | | |
| MC-5 | 0 | | |
| MC-6 | 0 | | |
| MC-7 | 0 | | |
| MC-8 | 0 | | |
| MC-9 | 0 | | |
| MC-10 | 0 | | |
| MC-11 | 0 | | |
| MC-12 | 1 | | |
| MC-13 | 1 | | |
| MC-14 | 1 | | |
| MC-15 | 1 | | |

Comparing FIG. 6 to FIG. 4, note that inverters 410–413 are replaced by inverters 610–613. This replacement indicates that in some cases it might be desirable to increase the gate sizes (or otherwise increase the speed) of the gates driving the four paths through tristate buffer circuit 600. This modification can in some cases ensure that no speed penalty results from the insertion of tristate buffer circuit 600.

FIG. 6 shows one possible embodiment 600 of a tristate buffer circuit that can be included in a LUT circuit implemented according to the present invention. However, many other implementations are possible for the tristate buffer circuit. For example, FIG. 7 illustrates a second tristate buffer circuit 700 that can be used in the embodiment of FIG. 6 (as well as in the embodiments of FIGS. 8 and 9, and in other embodiments not illustrated herein).

Figure 7:
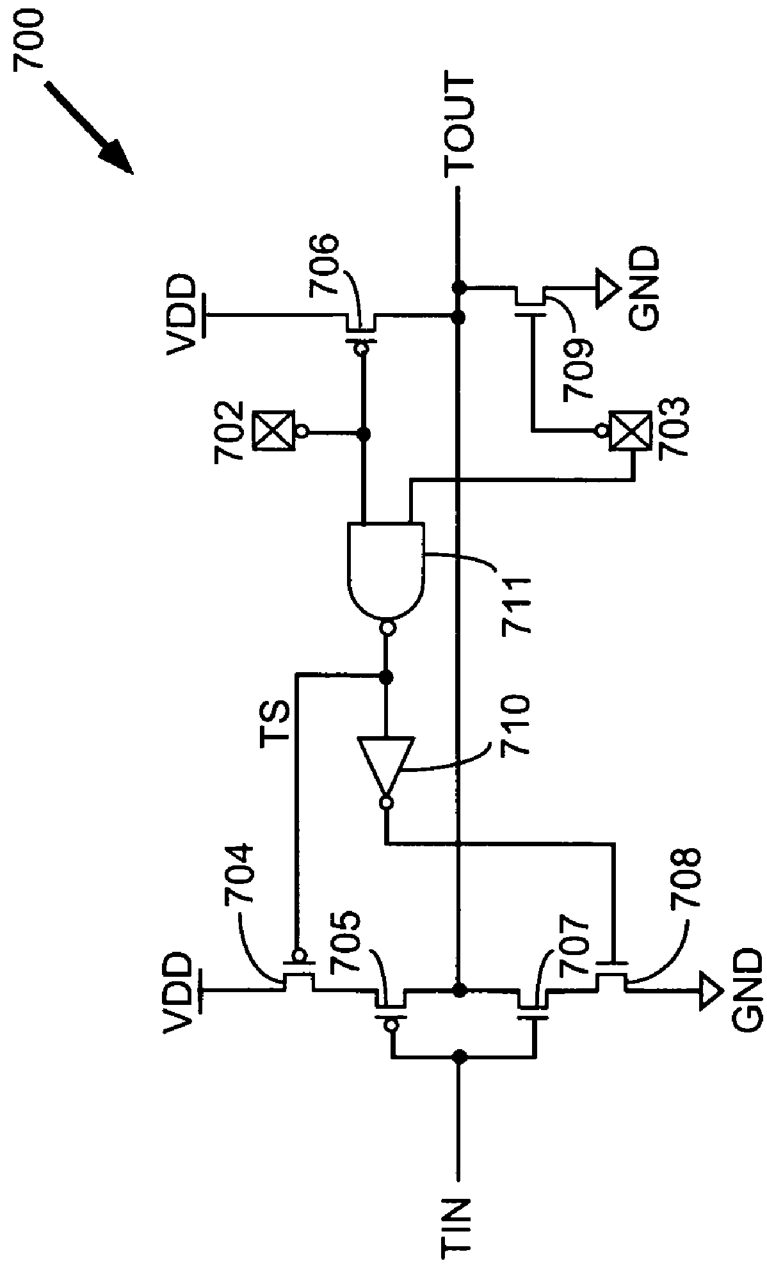
FIG. 7 illustrates a second tristate buffer circuit compatible with the LUT circuits of the present invention.

The tristate buffer circuit of FIG. 7 includes only two memory cells 702 and 703. Memory cell 702 controls pullup 706 on the tristate buffer output terminal TOUT. Memory cell 703 controls pulldown 709 on terminal TOUT. Transistors 704–705 and 707–708 are coupled in series between power high VDD and ground GND to form a tristate buffer driven by input signal TIN and optionally providing output signal TOUT. Transistor 704 is gated by tristate enable signal TS, which is provided by logical NAND gate 711. Logical NAND gate 711 is driven by the complementary output signal from memory cell 702 and the true output signal from memory cell 703. Transistor 708 is gated by inverter 710, which is driven by tristate enable signal TS.

In a first mode, tristate buffer circuit 700 functions as follows. (See Table 3.) A low value stored in memory cell 702 turns off P-channel transistor 706, and a high value in memory cell 703 turn off N-channel transistor 709. Logical NAND gate 711 provides a low value, i.e., tristate enable signal TS is low. Thus, the tristate function of the buffer is disabled, i.e., a value on the input terminal TIN of tristate buffer circuit 700 is passed to the output terminal TOUT. Therefore, the LUT circuit functions as a single 4-input LUT.

TABLE 3

| MC 702 | MC 703 | TS | Node TOUT |
|---|---|---|---|
| 0 | 0 | 1 | low (second mode) |
| 0 | 1 | 0 | input value (first mode) |
| 1 | 0 | 1 | contention, not supported |
| 1 | 1 | 1 | high (second mode) |

In the second mode, tristate buffer circuit 700 functions as follows. (See Table 3.) Memory cells 702 and 703 both store the same value. If the stored values are both high, pullup 706 is turned on, pulldown 709 is turned off, and tristate enable signal TS is high. Therefore, a high value is provided at output terminal TOUT. If the stored values are both low, pullup 706 is turned off, pulldown 709 is turned on, and tristate enable signal TS is high. Therefore, a low value is provided at output terminal TOUT. The state where memory cell 702 stores a high value and memory cell 703 stores a low value is not supported, as shown in Table 3, as contention will occur at the output terminal TOUT of tristate buffer circuit 700.

As in the embodiment of FIG. 6, in the second mode the value placed on the output terminal TOUT of tristate buffer circuit 700 can be either high or low. The choice of a high or low value (i.e., whether to enable pullup 706 or pulldown 709) is made based on the function to be implemented by the remaining input signals.

Figure 8:
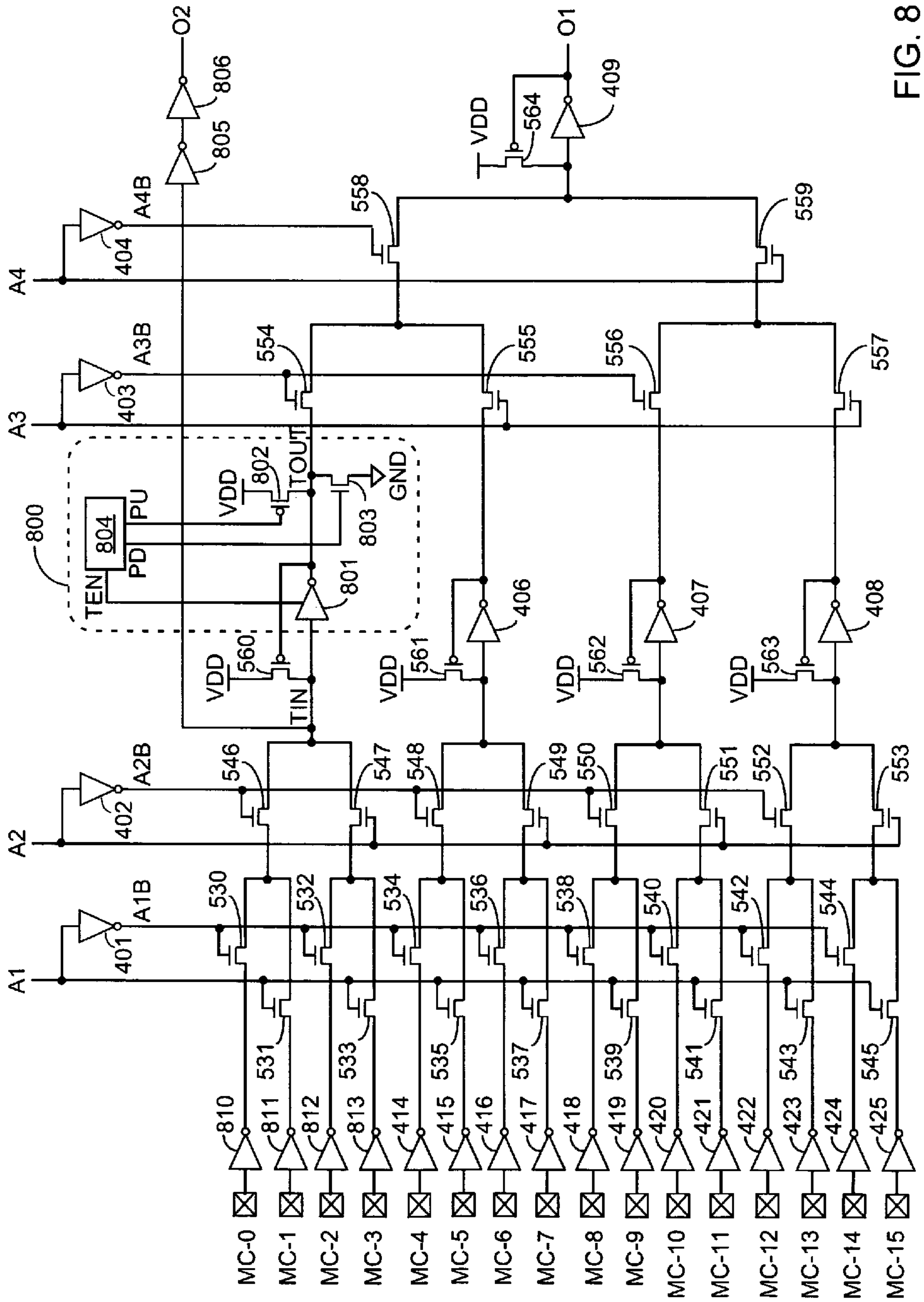
FIG. 8 illustrates a second 4-input LUT circuit according to an embodiment of the present invention, as well as a third tristate buffer circuit compatible with the LUT circuits of the present invention.

FIG. 8 illustrates a second 4-input LUT circuit according to an embodiment of the present invention, as well as a third buffer circuit compatible with the LUT circuits of the present invention. The LUT circuit of FIG. 8 is similar to that of FIG. 5. Similar elements are identified with the same reference numerals as in FIG. 5, and the recurring elements are not again described. However, in the LUT circuit of FIG. 8, inverter 405 of FIG. 5 is replaced by tristate buffer circuit 800, and the input signal TIN to tristate buffer circuit 800 traverses two inverters 805–806 to provide an additional LUT output signal O2.

Tristate buffer circuit 800 includes a tristate buffer 801 controlled by tristate enable signal TEN, a pullup 802 controlled by pullup control signal PU, and a pulldown 803 controlled by pulldown control signal PD. Tristate buffer 801 is coupled between the input terminal TIN and the output terminal TOUT of tristate buffer circuit 800. Pullup 802 and pulldown 803 are coupled to the output terminal TOUT of tristate buffer circuit 800. Signals TEN, PD, and PU are provided by a control circuit 804. Control circuit 804 can be implemented in various ways, including but not limited to the exemplary circuits illustrated in FIGS. 6 and 7. Table 4 illustrates the functionality of tristate buffer circuit 800.

TABLE 4

| TEN | PU | PD | Node TOUT |
|---|---|---|---|
| 0 | 0 | 0 | contention, not supported |
| 0 | 0 | 1 | contention, not supported |
| 0 | 1 | 0 | input value (first mode) |
| 0 | 1 | 1 | contention, not supported |
| 1 | 0 | 0 | high (second mode) |
| 1 | 0 | 1 | contention, not supported |
| 1 | 1 | 0 | floating, not supported |
| 1 | 1 | 1 | low (second mode) |

As in the embodiment of FIG. 6, when the second mode is selected, memory cells MC-4 through MC-7 store the same value, memory cells MC-8 through MC-11 store the same value, and memory cells MC-12 through MC-15 store the same value. Thus, the values on input signals A1 and A2 have no effect on the value at output terminal O1.

Comparing FIG. 8 to FIG. 5, note that inverters 410–413 are replaced by inverters 810–813. This replacement indicates that in some cases it might be desirable to increase the gate sizes (or otherwise increase the speed) of the gates driving the four paths through tristate buffer circuit 800. This modification can in some cases ensure that no speed penalty results from the insertion of tristate buffer circuit 800.

FIGS. 6 and 8 illustrate 4-input LUT circuits, each of which can be configured either as a single 4-input LUT or as two 2-input LUTs. However, the invention can also be applied to LUT circuits of other sizes. For example, the LUT circuits of FIGS. 6 and 8 can be expanded to 6-input LUTs, 8-input LUTs, and so forth by adding additional multiplexer stages either before or after the tristate buffer circuits, as will be clear to those of skill in the relevant arts.

Figure 9:
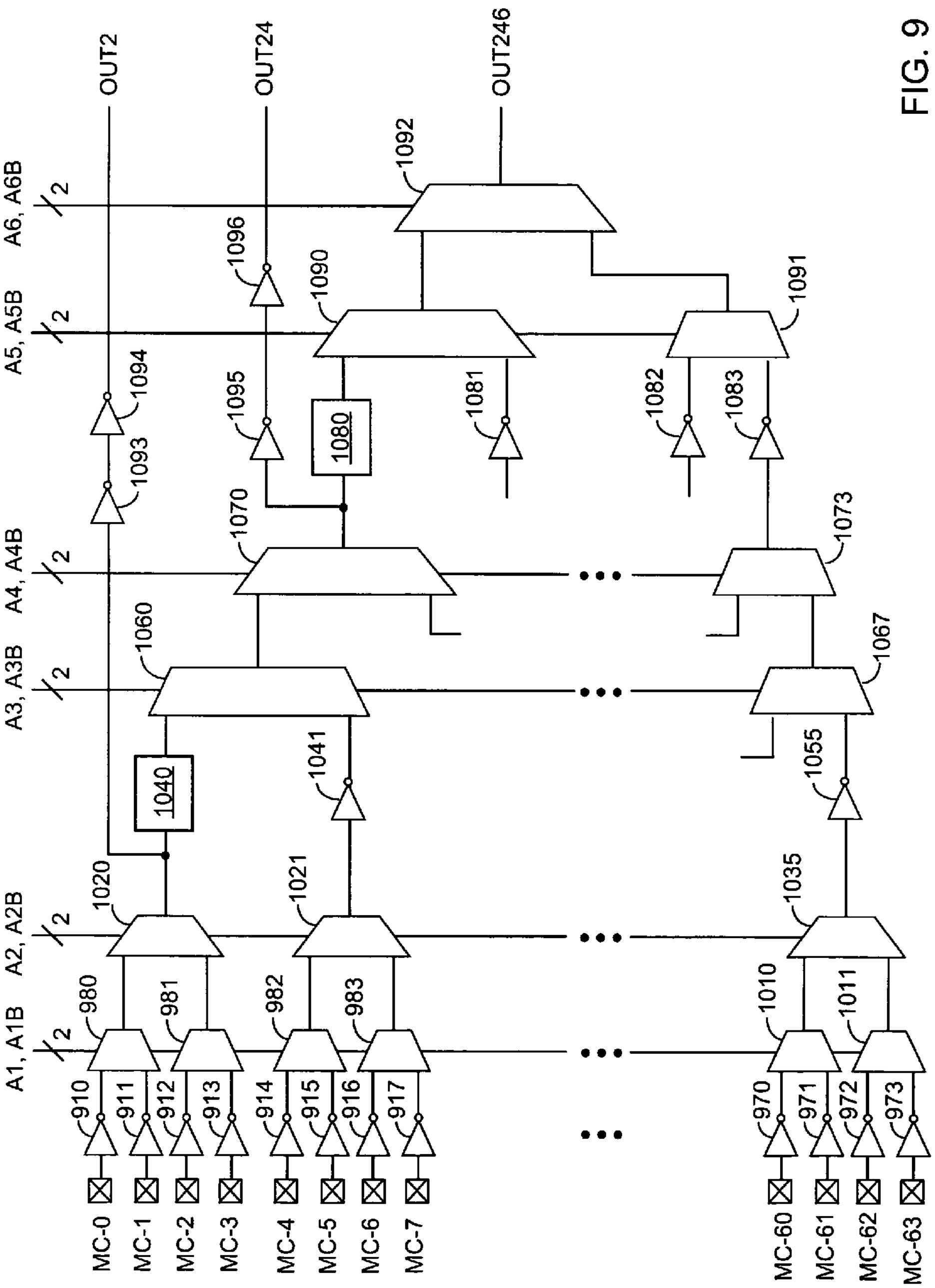
FIG. 9 illustrates a 6-input LUT circuit according to another embodiment of the present invention.

FIG. 9 provides an example of a larger LUT circuit having three optional configurations rather than two, according to another embodiment of the present invention. The LUT circuit of FIG. 9 includes six different multiplexer stages, each driven by a different independent input signal A1–A6. The complementary input signals A1B–A6B can also be supplied, as shown in FIG. 9. Using tristate buffer circuits inserted after the second and fourth stages of the multiplexer circuit, the LUT circuit of FIG. 9 can be configured as a single 6-input LUT, a 2-input LUT and a 4-input LUT with independent input signals, or three 2-input LUTs with independent input signals. The output signal from the single 6-input LUT appears at output terminal OUT246. The output signals from the 2-input and 4-input LUTs appear either at output terminals OUT2 and OUT246, or at output terminals OUT246 and OUT24, respectively. The output signals from the three 2-input LUTs appear at output terminals OUT2, OUT24, and OUT246.

Sixty-four configuration memory cells MC-0 through MC-63 drive sixty-four corresponding inverters 910–973, which are paired together to drive thirty-two 2-to-1 multiplexers 980–1011. Multiplexers 980–1011 together form the first stage of the multiplexer circuit, which is controlled by first input signal A1. Multiplexers 980–1011 can be implemented, for example, using CMOS pass gates or N-channel transistors as illustrated in the other figures herein. Multiplexers 980–1011 are paired to drive sixteen 2-to-1 multiplexers 1020–1035. Multiplexers 1020–1035 together form the second stage of the multiplexer circuit, which is controlled by second input signal A2. Multiplexers 1020–1035 can be implemented, for example, using CMOS pass gates or N-channel transistors as illustrated in the other figures herein.

In the pictured embodiment, multiplexer 1020 drives tristate buffer circuit 1040, as well as providing output signal OUT2 via inverters 1093 and 1094. Multiplexer 1021 drives buffer 1041, and the other multiplexers in the second stage drive corresponding buffers, including multiplexer 1035 which drives inverter 1055. Buffers 1041–1055 can optionally include a pullup (not shown in FIG. 9), as shown in FIGS. 5 and 8. Tristate buffer circuit 1040 can be implemented in a fashion similar to that of circuits 600, 700, and 800, or in some other fashion.

In the third stage of the multiplexer, tristate buffer circuit 1040 and buffers 1041–1055 are paired to drive eight 2-to-1 multiplexers 1060–1067. Multiplexers 1060–1067 are controlled by third input signal A3. Multiplexers 1060–1067 can be implemented, for example, using CMOS pass gates or N-channel transistors as illustrated in the other figures herein. Multiplexers 1060–1067 are paired to drive four 2-to-1 multiplexers 1070–1073. Multiplexers 1070–1073 together form the fourth stage of the multiplexer circuit, which is controlled by fourth input signal A4. Multiplexers 1070–1073 can be implemented, for example, using CMOS pass gates or N-channel transistors as illustrated in the other figures herein.

In the pictured embodiment, multiplexer 1070 drives tristate buffer circuit 1080, as well as providing output signal OUT24 via inverters 1095 and 1096. Additional multiplexers (not shown) in the fourth stage drive corresponding buffers 1081–1082, and multiplexer 1073 drives buffer 1083. Buffers 1081–1083 can optionally include a pullup (not shown in FIG. 9), as shown in FIGS. 5 and 8. Tristate buffer circuit 1080 can be implemented in a fashion similar to that of circuits 600, 700, and 800, or in some other fashion.

In the fifth stage of the multiplexer, tristate buffer circuit 1080 and buffers 1081–1083 are paired to drive 2-to-1 multiplexers 1090–1091. Multiplexers 1090–1091 are controlled by fifth input signal A5. Multiplexers 1090–1091 can be implemented, for example, using CMOS pass gates or N-channel transistors as illustrated in the other figures herein. Multiplexers 1090–1091 are paired to drive 2-to-1 multiplexer 1092. Multiplexer 1092 forms the sixth stage of the multiplexer circuit, which is controlled by sixth input signal A6. Multiplexer 1092 can be implemented, for example, using CMOS pass gates or N-channel transistors as illustrated in the other figures herein. Multiplexer 1092 provides output signal OUT246.

As in the embodiments of FIGS. 6 and 8, the contents of the memory cells must be selected to ensure the proper functioning of the LUT, based on the mode in which the LUT is operating.

Those having skill in the relevant arts of the invention will now perceive various modifications and additions that can be made as a result of the disclosure herein. For example, the LUT circuits illustrated herein each include two multiplexer stages between each pair of buffers and/or tristate buffer circuits. However, one or more than two stages can be supplied before and/or after the butters and tristate buffer circuits. Further, the above text describes the circuits of the invention in the context of field programmable gate arrays (FPGAs). However, the LUT circuits of the invention can also be included in other types of programmable logic devices (PLDs).

Further, pullups, pulldowns, transistors, P-channel transistors, N-channel transistors, pass gates, CMOS pass gates, multiplexers, buffers, tristate buffers, tristate buffer circuits, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A lookup table (LUT) circuit, comprising:

- a plurality of memory cells;
- a plurality of LUT input terminals;
- first and second LUT output terminals;
- a first multiplexer stage having input terminals coupled to the memory cells, select terminals coupled to at least a first one of the input terminals, and output terminals, a first output terminal of the first multiplexer stage being coupled to the first LUT output terminal;
- a second multiplexer stage having input terminals coupled to the output terminals of the first multiplexer stage, select terminals coupled to at least a second one of the input terminals, and an output terminal coupled to the second LUT output terminal; and
- a tristate buffer circuit coupled between the first output terminal of the first multiplexer stage and a first input terminal of the second multiplexer stage.

2. The LUT circuit of claim 1, wherein the tristate buffer circuit comprises:

- a data input terminal coupled to the first output terminal of the first multiplexer stage;
- a data output terminal coupled to the first input terminal of the second multiplexer stage;
- a tristate buffer having an input terminal coupled to the data input terminal, an output terminal coupled to the data output terminal, and an enable terminal;
- a pullup circuit coupled to the data output terminal and having an enable terminal;
- a pulldown circuit coupled to the data output terminal and having an enable terminal; and
- a control circuit coupled to the enable terminals of the pullup circuit, the pulldown circuit, and the tristate buffer.

3. The LUT circuit of claim 2, wherein the control circuit comprises:

a first memory cell coupled to the enable terminal of the pullup circuit;

a second memory cell coupled to the enable terminal of the pulldown circuit; and a tristate enable control circuit coupled to the enable terminal of the tristate buffer.

4. The LUT circuit of claim 3, wherein the LUT circuit forms a portion of a programmable logic device (PLD).

5. The LUT circuit of claim 4, wherein the PLD is an FPGA, and the first and second memory cells comprise configuration memory cells of the FPGA.

6. The LUT circuit of claim 3, wherein the tristate enable control circuit comprises a third memory cell.

7. The LUT circuit of claim 3, wherein the tristate enable control circuit comprises a logic gate having input terminals coupled to the first and second memory cells and an output terminal coupled to the enable terminal of the tristate buffer.

8. The LUT circuit of claim 7, wherein the logic gate is a logical NAND gate.

9. The LUT circuit of claim 1, further comprising a plurality of inverting logic gates, and wherein the first and second multiplexer stages each comprise a plurality of CMOS pass gates coupled between the input terminals and the output terminals of a corresponding multiplexer stage, the CMOS pass gates having first gate terminals coupled to the LUT input terminals and second gate terminals coupled to the LUT input terminals via the inverting logic gates.

10. The LUT circuit of claim 1, wherein the first and second multiplexer stages each comprise a plurality of N-channel transistors coupled between the input terminals and the output terminals of a corresponding multiplexer stage, the N-channel transistors having gate terminals coupled to the LUT input terminals.

11. The LUT circuit of claim 10, further comprising a plurality of pullup circuits each coupled to a corresponding output terminal of the first multiplexer stage, each pullup circuit having an enable terminal coupled to an input terminal of the second multiplexer stage.

12. A lookup table (LUT) circuit, comprising:

a plurality of memory cells;

a plurality of LUT input terminals;

first, second, and third LUT output terminals;

a first multiplexer stage having input terminals coupled to the memory cells, select terminals coupled to at least a first one of the input terminals, and output terminals, a first output terminal of the first multiplexer stage being coupled to the first LUT output terminal;

a second multiplexer stage having input terminals coupled to the output terminals of the first multiplexer stage, select terminals coupled to at least a second one of the input terminals, and output terminals, a first output terminal of the second multiplexer stage being coupled to the second LUT output terminal;

a third multiplexer stage having input terminals coupled to the output terminals of the second multiplexer stage, select terminals coupled to at least a third one of the input terminals, and an output terminal coupled to the third LUT output terminal;

a first tristate buffer circuit coupled between a first output terminal of the first multiplexer stage and a first input terminal of the second multiplexer stage; and a second tristate buffer circuit coupled between a first output terminal of the second multiplexer stage and a first input terminal of the third multiplexer stage.

13. The LUT circuit of claim 12, wherein each of the first and second tristate buffer circuits comprises:

a data input terminal coupled to the first output terminal of a corresponding preceding multiplexer stage;

a data output terminal coupled to the first input terminal of a corresponding following multiplexer stage;

a tristate buffer having an input terminal coupled to the data input terminal, an output terminal coupled to the data output terminal, and an enable terminal;

a pullup circuit coupled to the data output terminal and having an enable terminal;

a pulldown circuit coupled to the data output terminal and having an enable terminal; and a control circuit coupled to the enable terminals of the pullup circuit, the pulldown circuit, and the tristate buffer.

14. The LUT circuit of claim 13, wherein the LUT circuit forms a portion of a programmable logic device (PLD), and the control circuit comprises a plurality of configuration memory cells for the PLD.

15. A programmable logic device (PLD), comprising:

an interconnect structure; and a plurality of lookup table (LUT) circuits programmably coupled to the interconnect structure, each LUT circuit comprising:

a plurality of memory cells;

a plurality of LUT input terminals programmably coupled to the interconnect structure;

first and second LUT output terminals programmably coupled to the interconnect structure;

a first multiplexer stage having input terminals coupled to the memory cells, select terminals coupled to at least a first one of the input terminals, and output terminals, a first output terminal of the first multiplexer stage being coupled to the first LUT output terminal;

a second multiplexer stage having input terminals coupled to the output terminals of the first multiplexer stage, select terminals coupled to at least a second one of the input terminals, and an output terminal coupled to the second LUT output terminal; and a tristate buffer circuit coupled between a first output terminal of the first multiplexer stage and a first input terminal of the second multiplexer stage.

16. The PLD of claim 15, wherein the tristate buffer circuit comprises:

a data input terminal coupled to the first output terminal of the first multiplexer stage;

a data output terminal coupled to the first input terminal of the second multiplexer stage;

a tristate buffer having an input terminal coupled to the data input terminal, an output terminal coupled to the data output terminal, and an enable terminal;

a pullup circuit coupled to the data output terminal and having an enable terminal;

a pulldown circuit coupled to the data output terminal and having an enable terminal; and a control circuit coupled to the enable terminals of the pullup circuit, the pulldown circuit, and the tristate buffer.

17. The PLD of claim 16, wherein the control circuit comprises:

a first memory cell coupled to the enable terminal of the pullup circuit;

a second memory cell coupled to the enable terminal of the pulldown circuit; and a tristate enable control circuit coupled to the enable terminal of the tristate buffer.

18. The PLD of claim 17, wherein the PLD is an FPGA, and the first and second memory cells comprise configuration memory cells of the FPGA.

19. The PLD of claim 17, wherein the tristate enable control circuit comprises a third memory cell.

20. The PLD of claim 17, wherein the tristate enable control circuit comprises a logic gate having input terminals coupled to the first and second memory cells and an output terminal coupled to the enable terminal of the tristate buffer.

21. The PLD of claim 20, wherein the logic gate is a logical NAND gate.

22. The PLD of claim 15, wherein each LUT circuit further comprises a plurality of inverting logic gates, and wherein the first and second multiplexer stages each comprise a plurality of CMOS pass gates coupled between the input terminals and the output terminals of a corresponding multiplexer stage, the CMOS pass gates having first gate terminals coupled to the LUT input terminals and second gate terminals coupled to the LUT input terminals via the inverting logic gates.

23. The PLD of claim 15, wherein the first and second multiplexer stages each comprise a plurality of N-channel transistors coupled between the input terminals and the output terminals of a corresponding multiplexer stage, the N-channel transistors having gate terminals coupled to the LUT input terminals.

24. The PLD of claim 23, further comprising a plurality of pullup circuits each coupled to a corresponding output terminal of the first multiplexer stage, each pullup circuit having an enable terminal coupled to an input terminal of the second multiplexer stage.

25. A programmable logic device (PLD), comprising:

an interconnect structure; and a plurality of lookup table (LUT) circuits programmably coupled to the interconnect structure, each LUT circuit comprising:

a plurality of memory cells;

a plurality of LUT input terminals;

first, second, and third LUT output terminals;

a first multiplexer stage having input terminals coupled to the memory cells, select terminals coupled to at least a first one of the input terminals, and output terminals, a first output terminal of the first multiplexer stage being coupled to the first LUT output terminal;

a second multiplexer stage having input terminals coupled to the output terminals of the first multiplexer stage, select terminals coupled to at least a second one of the input terminals, and output terminals, a first output terminal of the second multiplexer stage being coupled to the second LUT output terminal;

a third multiplexer stage having input terminals coupled to the output terminals of the second multiplexer stage, select terminals coupled to at least a third one of the input terminals, and an output terminal coupled to the third LUT output terminal;

a first tristate buffer circuit coupled between a first output terminal of the first multiplexer stage and a first input terminal of the second multiplexer stage; and a second tristate buffer circuit coupled between a first output terminal of the second multiplexer stage and a first input terminal of the third multiplexer stage.

26. The PLD of claim 25, wherein each of the first and second tristate buffer circuits comprises:

a data input terminal coupled to the first output terminal of a corresponding preceding multiplexer stage;

a data output terminal coupled to the first input terminal of a corresponding following multiplexer stage;

a tristate buffer having an input terminal coupled to the data input terminal, an output terminal coupled to the data output terminal, and an enable terminal;

a pullup circuit coupled to the data output terminal and having an enable terminal;

a pulldown circuit coupled to the data output terminal and having an enable terminal; and a control circuit coupled to the enable terminals of the pullup circuit, the pulldown circuit, and the tristate buffer.

27. The PLD of claim 26, wherein each of the control circuits comprises a plurality of configuration memory cells for the PLD.

* * * * *